United States Patent
Aonuma et al.

(10) Patent No.: US 7,272,889 B2
(45) Date of Patent: Sep. 25, 2007

(54) PRODUCTION METHOD OF SUSPENSION BOARD WITH CIRCUIT

(75) Inventors: Hidenori Aonuma, Osaka (JP); Yasuhito Ohwaki, Osaka (JP)

(73) Assignee: Nitto Denko Corporation, Osaka (JP)

( * ) Notice: Subject to any disclaimer, the term of this patent is extended or adjusted under 35 U.S.C. 154(b) by 284 days.

(21) Appl. No.: 11/156,607

(22) Filed: Jun. 21, 2005

(65) Prior Publication Data
US 2005/0282088 A1 Dec. 22, 2005

(30) Foreign Application Priority Data
Jun. 22, 2004 (JP) ............................ 2004-183435

(51) Int. Cl.
*H01K 3/10* (2006.01)
(52) U.S. Cl. ............................ 29/852; 29/830; 29/832; 29/840; 438/678; 438/687
(58) Field of Classification Search ................ 29/830, 29/832, 840, 852; 438/678, 687
See application file for complete search history.

(56) References Cited

U.S. PATENT DOCUMENTS

| | | |
|---|---|---|
| 5,858,518 A | 1/1999 | Omote et al. |
| 6,096,482 A | 8/2000 | Omote et al. |
| 6,100,582 A | 8/2000 | Omote et al. |
| 6,395,633 B1 * | 5/2002 | Cheng et al. ............... 438/687 |

FOREIGN PATENT DOCUMENTS

JP HEI 10-265572 10/1998

* cited by examiner

*Primary Examiner*—Carl J. Arbes
(74) *Attorney, Agent, or Firm*—Akerman Senterfitt; Jean C. Edwards, Esq.

(57) ABSTRACT

A production method of a suspension board with circuit that can provide reduced number of man-hour and complicated processes for forming the ground terminal, to provide production cost reduction. An insulating base layer 4 having a base opening portion 3 is formed on a metal board 2 at a ground terminal 13 forming position, and a thin metal film 5 is formed on the metal board 2 exposed in the base opening portion 3 and on the insulating base layer 4. Then, a conductive pattern 7 is formed on the thin metal film 5. Then, an insulating cover layer 9 covering the conductive pattern 7 and having a cover opening portion 8 which correspond in position to the base opening portion 3 is formed on the insulating base layer 4. Then, a metal board opening portion 11 from which the base opening portion 3 and the insulating base layer 4 around it are exposed is formed in the metal board 2. Then, an electrolytic plating layer 12 is formed on each side of the conductive pattern 7 exposed in the cover opening portion 8, feeding electric power from the conductive pattern 7, and a metal filling layer 14 is formed in the metal board opening portion 11, to allow the electrolytic plating layer 12 and the metal board 2 to be conductive with each other.

1 Claim, 5 Drawing Sheets

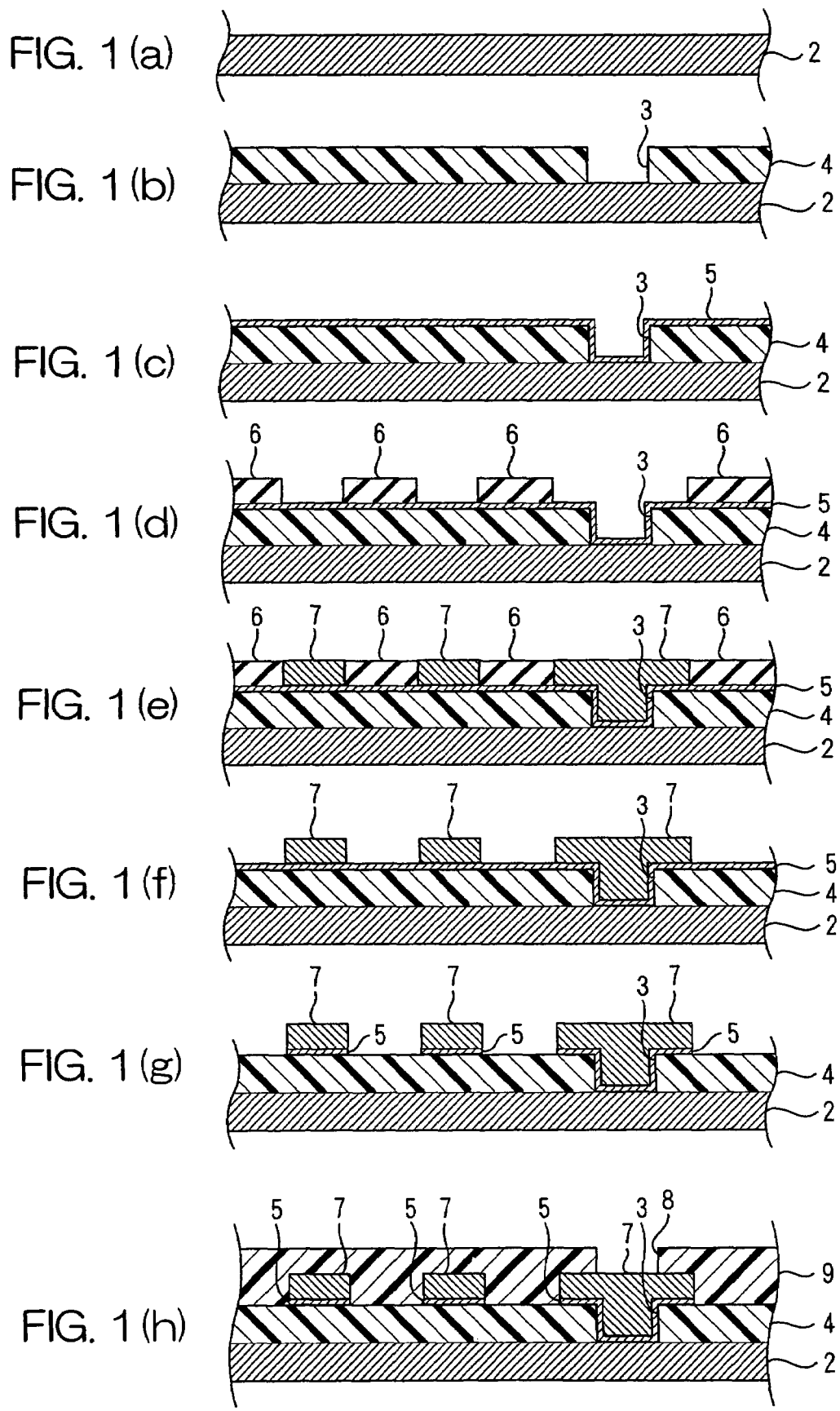

PRODUCTION METHOD OF SUSPENSION BOARD WITH CIRCUIT

BACKGROUND OF THE INVENTION

1. Field of the Invention

The present invention relates to a production method of a suspension board with circuit and, more particularly, to a production method of a suspension board with circuit having a ground terminal.

2. Description of the Prior Art

In recent years, improvements in transmission speed and transmission accuracy are increasingly demanded for storage units, such as computers and their peripheral devices. In the circumstances, there are increasing tendencies to use high-frequency signals for electric signals. But, noises in electric signals transmitted increase with frequency.

In general, a suspension board with circuit mounted on a hard disc comprises an insulating layer formed on a metal foil serving as a metal board, and a conductor layer serving as a conductive pattern formed on the insulating layer (Cf. JP Laid-open (Unexamined) Patent Publication No. Hei 10-265572, for example). In this suspension board with circuit, difference in the electrical potentials between the metal board and the conductive pattern can cause noise generation.

In order to reduce the noises, the suspension board with circuit is structured so that a ground terminal is formed in the conductive pattern to put the conductive pattern in conductive relationship with the metal board, so as to allow the conductive pattern to connect with the ground by connecting the ground terminal of the conductive pattern with a ground terminal of an electronic component such as a magnetic head.

Also, in order to prevent corrosion, a gold plating layer is formed on the ground terminal of the conductive pattern by electrolytic gold plating.

The gold plating layer is formed on the ground terminal in the following manner. First, the suspension board with circuit 1 before configured is covered with a plating resist 17 so that only a ground terminal 13 forming portion of the conductive pattern 7 can be exposed from the plating resist 17, as shown in FIG. 5(*a*). Then, a gold plating layer 12 is formed on the ground terminal 13 forming portion of the conductive pattern 7 by electrolytic gold plating, while feeding electric power from the metal board 2, as shown in FIG. 5(*b*). Thereafter, the plating resist 17 is removed, as shown in FIG. 5(*c*). In FIG. 5, the same reference numerals and marks are labeled to corresponding parts to those shown in FIG. 1.

In the method illustrated above, since the electric power is fed from the metal board 2, the whole area of the suspension board with circuit 1 except the ground terminal 13 forming portion of the conductive pattern 7 must be covered with the plating resist 17, in order to prevent the gold plating layer 12 from being formed on the metal board 2. On the other hand, the formation of the plating resist 17 and the subsequent removal process of the same require cumbersome and complicated processes, such as adhesion, exposure-to-light, development, and stripping of the plating resist 17, thus causing production cost increase.

SUMMARY OF THE INVENTION

It is the object of the invention to provide a production method of a suspension board with circuit that can provide reduced number of man-hour and complicated processes for forming the ground terminal, to provide production cost reduction.

The present invention provide a production method of a suspension board with circuit comprising the step of preparing a metal board, the step of forming on the metal board an insulating base layer having a base opening portion from which the metal board is exposed at a ground terminal forming portion thereof, the step of forming a thin metal film on the metal board exposed in the base opening portion and on the insulating base layer, the step of forming on the thin metal film a conductive pattern in such a manner as to cover the thin metal film exposed in the base opening portion, the step of forming on the insulating base layer an insulating cover layer covering the conductive pattern and having a cover opening portion which correspond in position to the base opening portion and from which the conductive pattern is exposed, the step of forming in the metal board a metal board opening portion from which the base opening portion and the insulating base layer around it are exposed, the step of forming an electrolytic plating layer on the conductive pattern exposed in the cover opening portion, feeding electric power from the conductive pattern, and the step of forming a metal filling layer in the metal board opening portion, to allow the electrolytic plating layer and the metal board to be conductive with each other.

According to the production method of the suspension board with circuit, the base opening portion and the metal board opening portion from which an area of the insulating base layer around the base opening portion is exposed are formed on the metal board, in other words, the metal board opening portion is formed to be larger than the base opening portion, so that the conductive relationship between the meal board and the conductive pattern is blocked. Then, the electrolytic plating layer is formed on the conductive pattern in the cover opening portion, feeding electric power from the conductive pattern. This can provide the results that the electrolytic plating layer can be formed on the conductive pattern at the ground terminal forming position, without any need for covering the conductive pattern with the plating resist and that the ground terminal can be formed by forming the metal filling layer in the subsequent process. This can provide a reduced number of man-hour and complicated processes for forming the ground terminal, thus achieving the production cost reduction.

BRIEF DESCRIPTION OF THE DRAWINGS

In the drawings:

FIG. 1 is a process drawing showing an embodiment of a production method of a suspension board with circuit of the present invention:

Figure 5A:
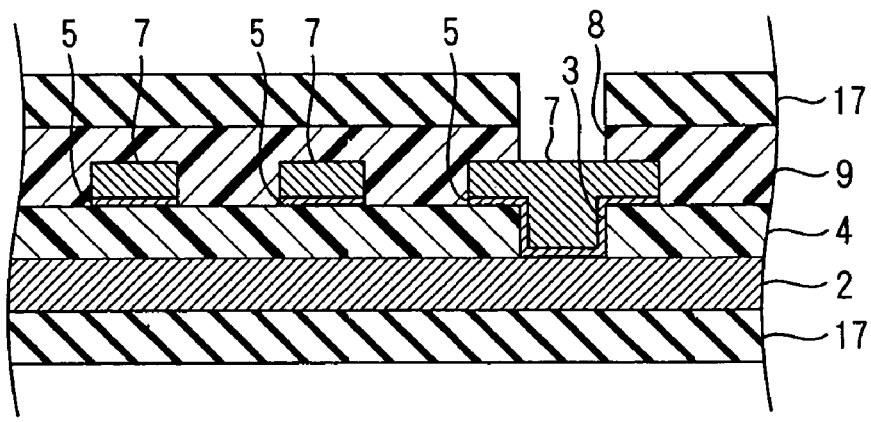
Figure 5B:
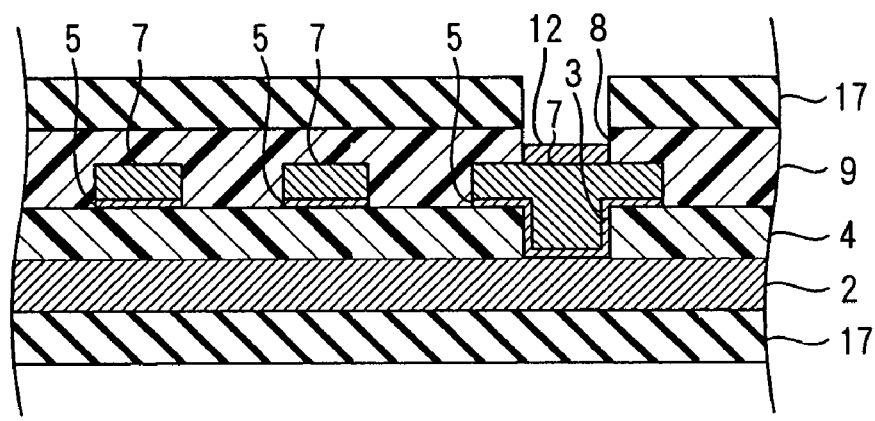
Figure 5C:
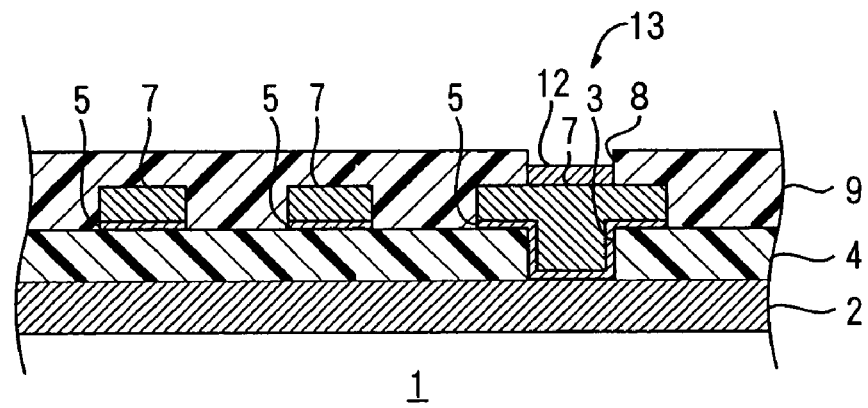

(a) shows the process of preparing a metal board;

(b) shows the process of forming an insulating base layer on the metal board in a predetermined pattern having a base opening portion, (c) shows the process of forming a thin metal film on the entire surface of the insulating base layer and on a surface of the metal board exposed from the base opening, (d) shows the process of forming on the thin metal film a plating resist of a pattern reverse to a conductive pattern, (e) shows the process of forming the conductive pattern, (f) shows the process of removing the plating resist, (g) shows the process of removing the thin metal film exposed from the conductive pattern by etching, and (h) shows the process of forming an insulating cover layer in a predetermined pattern having a cover opening portion, FIG. 2 is a process drawing, which is the sequence of FIG. 1, showing the embodiment of the production method of the suspension board with circuit:

(i) shows the process of forming an etching resist on the entire surface of the metal board on the side opposite to the insulating base layer, except a part thereof corresponding to the base opening portion and its surrounding portion, (j) shows the process of removing the metal board exposed from the etching resist by etching, (k) shows the process of removing the etching resist, (l) shows the process of forming an electrolytic plating layer on the conductive pattern exposed from the cover opening portion by electrolytic plating, and (m) shows the process of forming a metal filling layer in the base opening portion, FIG. 3 is a process drawing for illustrating details of the process of forming the insulating base layer of FIG. 1(b) in the predetermined pattern:

(a) shows the process of forming a coating on the metal board, (b) shows the process of exposing the coating to light, (c) shows the process of developing the coating, and (d) shows the process of curing the coating, FIG. 4 is a process drawing for illustrating details of the process of forming the insulating cover layer of FIG. 1(h) in the predetermined pattern:

(a) shows the process of forming a coating on the insulating base layer, to cover the conductive pattern, (b) shows the process of exposing the coating to light, (c) shows the process of developing the coating, and (d) shows the process of curing the coating, and FIG. 5 is a process drawing showing an embodiment of a conventional production method of a suspension board with circuit:

(a) shows the process of covering a suspension board with circuit, before configured, with a plating resist so that only a ground terminal forming portion of a conductive pattern can be exposed from the plating resist;

(b) shows the process of forming a plating layer on the ground terminal forming portion of the conductive pattern by electrolytic plating, while feeding electric power from the metal board, and (c) shows the process of removing the plating resist.

DETAILED DESCRIPTION OF THE PREFERRED EMBODIMENTS

FIG. 1 is a process drawing showing an embodiment of a production method of a suspension board with circuit of the present invention.

In the method illustrated in FIG. 1, a metal board 2 is prepared, first, as shown in FIG. 1(a). No particular limitation is imposed on the metal board 2. For example, a metal foil or a thin metal sheet is used for the metal board 2. The metals that may be used for the metal board 2 include, for example, stainless steel, 42-alloy, aluminum, copper-beryllium, and phosphor bronze. Stainless steel is preferably used. Preferably, the metal board 2 has a thickness of 10-60 μm, or preferably 15-30 μm.

Then, an insulating base layer 4 is formed on the metal board 2 in a predetermined pattern, as shown in FIG. 1(b), such that a base opening portion 3 from which a surface of the metal board 2 is exposed is formed in the insulating layer 4 at a location at which a ground terminal 13 mentioned later is formed.

The insulating materials that may be used for forming the insulating base layer 4 include, for example, synthetic resins, such as polyimide resin, polyamide imide resin, acrylic resin, polyether nitrile resin, polyether sulfonic resin, polyethylene terephthalate resin, polyethylene naphthalate resin, and polyvinyl chloride resin. Of these synthetic resins, a photosensitive synthetic resin is preferably used for the insulating base layer 4. The photosensitive polyimide resin is further preferably used therefor.

Figure 3A:
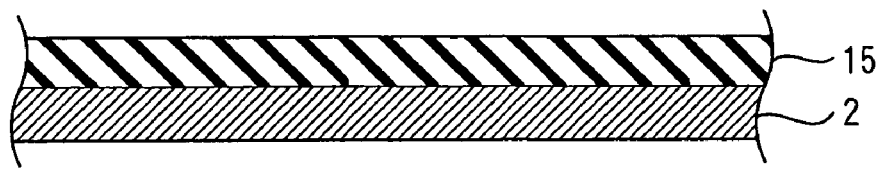

For example when photosensitive polyimide resin is used to form the insulating base layer 4 on the metal board 2 in the predetermined pattern including the base opening portion 3, a solution of precursor of the photosensitive polyimide resin (polyamic acid resin) is coated over the entire surface of the metal board 2, first, as shown in FIG. 3(a). Then, the coated polyimide resin is heated at e.g. 60-150° C., or preferably at 80-120° C., to form a coating 15 of the precursor of the photosensitive polyimide resin.

Figure 3B:
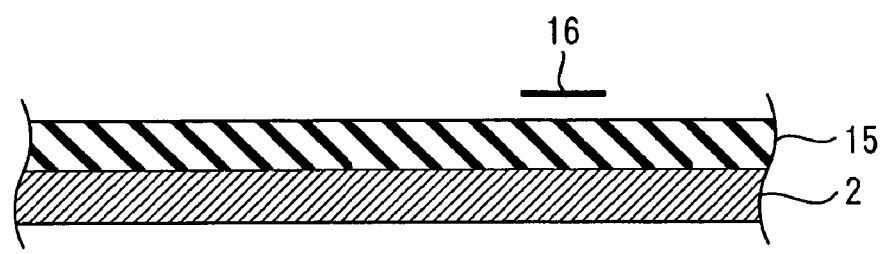
Figure 3C:
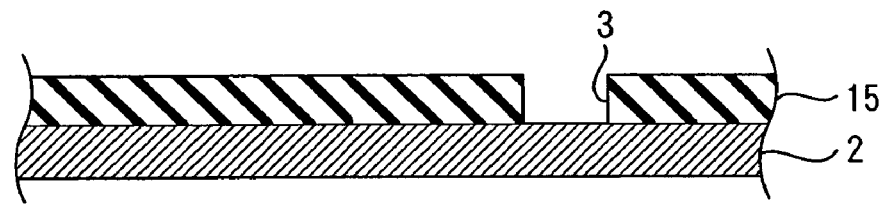

Then, the coating 15 is exposed to light through a photo mask 16, as shown in FIG. 3(b), and, if required, its portion to be exposed to light is heated to a predetermined temperature. Thereafter, the coating 15 is developed to be formed into the predetermined pattern including the base opening portion 3. Preferably, radiation irradiated through the photo mask 16 has an exposure wavelength of 300-450 nm, or preferably 350-420 nm. Also, an integrated quantity of exposure light is preferably in the range of 100-1,200 mJ/cm², or preferably in the range of 200-1,200 mJ/cm².

When the exposed-to-light portion of the coating 15 irradiated is heated at a temperature of e.g. 130° C. or more to less than 150° C., it is solubilized (positive type) in the next developing process. On the other hand, when heated at a temperature of e.g. 150° C. or more to 180° C. or less, it is insolubilized (negative type) in the next developing process. The development can be performed by any known method, such as a dipping process and a spraying process, using a known developing solution such as alkaline developer. In this method, it is preferable that the negative pattern is formed in the coating 15. Illustrated in FIG. 3 is an embodiment using the process steps for forming the negative pattern.

Figure 3D:
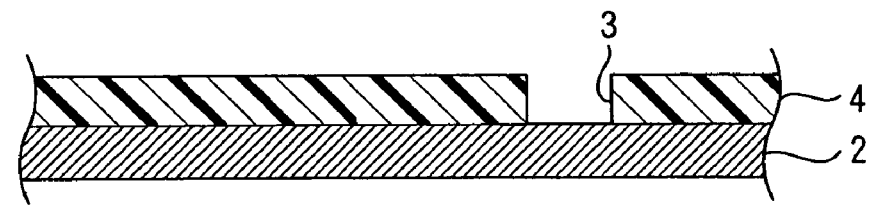

Then, the coating 15 of the precursor of the photosensitive polyimide resin thus patterned is heated finally to e.g. 250° C. or more to be cured (imidized), whereby the insulating base layer 4 of polyimide resin is formed with the predetermined pattern including the base opening portion 3 on the metal board 2, as shown in FIG. 3(d).

As an alternative to the photosensitive synthetic resin, for example synthetic resin may be coated over the metal board 2 with the predetermined pattern or a dry film having the predetermined pattern may be adhesively stuck thereto. In this alternation, the base opening portion 3 is formed in the patterned synthetic resin after coated or stuck, or is formed in the dry film before stuck, by a known process such as, for example, punching, drilling, laser-drilling, and etching.

Preferably, the insulating base layer 4 thus formed has thickness of e.g. 2-30 μm, or preferably 5-20 μm. No particular limitation is imposed on the shape of the base opening portion 3. The base opening portion 3 may be formed in any selective form, such as a circular form and a rectangular form. When formed in a circular form, the base opening portion 3 is preferably in the range of e.g. 30-2,000 μm, or preferably 60-1,000 μm, in diameter. When formed in a rectangular form, the base opening portion 3 is preferably in the range of e.g. 30-2,000 μm, or preferably 60-1,000 μm, on a side.

Then, a thin metal film 5 serving as a seed film in the additive process is formed on the entire surface of the base insulating layer 4 and on a surface of the metal board 2 exposed from the base opening portion 3 in the insulating base layer 4, as shown in FIG. 1(c).

The thin metal film 5 is formed using a vacuum deposition process, or preferably using a sputtering process. Chromium and copper are preferably used as the metal used for the thin metal film 5. To be more specific, for example a thin chrome film and a thin copper film are preferably formed in sequence on the entire surface of the insulating base layer 4 and the surface of the metal board 2 exposed from the base opening portion 3 in the insulating base layer 4 by the sputtering process. Preferably, the thin chrome film has thickness of 100-600 Å and the thin copper film has thickness of 500-2,000 Å.

Then, the conductive pattern 7 is formed on the thin metal film 5, as shown in FIG. 1(d)-(g). The conductive pattern 7 includes a signal line pattern to transmit signals input and output from and to a magnetic head (not shown), and a ground line pattern to be connected between a ground terminal of the magnetic head (not shown) and a ground terminal 13 mentioned later. The ground line pattern includes a ground terminal 13 forming position, at which conductive material is filled in the base opening portion 3.

The conductive materials that may be used for forming the conductive pattern 7 include, for example, copper, nickel, gold, solder, or alloys thereof. Preferably, copper is used for forming the conductive pattern 7.

The conductive pattern 7 is formed in the form of the wiring pattern as mentioned above using the additive process. Specifically, a plating resist 6 having a reverse pattern to the wiring pattern is formed on the thin metal film 5, first, as shown in FIG. 1(d). The plating resist 6 is formed in the form of the resist pattern by a known process using e.g. a dry film photoresist which is to be exposed to light and then developed. Then, the conductive pattern 7 in the form of the wiring pattern mentioned above is formed on the thin metal film 5 exposed from the plating resist 6 by electrolytic plating, or preferably by electrolytic copper plating, as shown in FIG. 1(e).

The conductive pattern 7 has thickness of e.g. 2-15 μm or preferably 5-10 μm.

Then, the plating resist 6 is removed by a known etching process, such as a chemical etching (wet etching), or by stripping, as shown in FIG. 1(f).

Thereafter, the thin metal film 5 exposed from the conductive pattern 7 (or the thin metal film 5 on which the plating resist 6 was formed) is also removed by the known etching process, such as the chemical etching (wet etching), as shown in FIG. 1(g).

Then, an insulating cover layer 9 for covering the conductive pattern 7 is formed in a predetermined pattern, as shown in FIG. 1(h), such that a cover opening portion 8 is formed to correspond in position to the base opening portion 3 and allow the conductive pattern 7 to be exposed from it. The same insulating materials as those for forming the insulating base layer 4 may be used for forming the insulating cover layer 9. Preferably, photosensitive polyimide resin is used for forming the insulating cover layer 9.

Figure 4A:
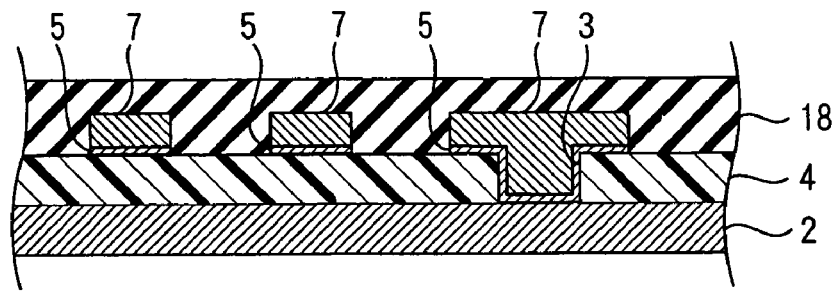
Figure 4B:
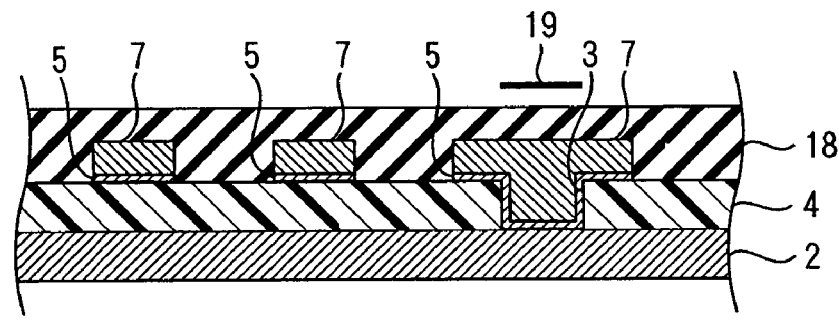
Figure 4C:
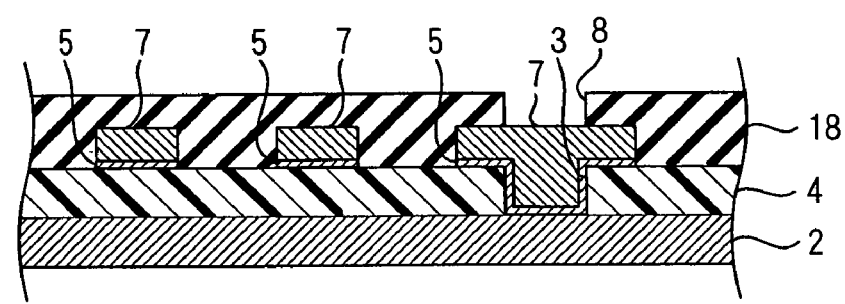

For example when photosensitive polyimide resin is used to form the insulating cover layer 9, a solution of precursor of the photosensitive polyimide resin (polyamic acid resin) is coated over the insulating base layer 4 to cover the conductive pattern 7, as shown in FIG. 4(a). Then, the coated polyimide resin is heated at e.g. 60-150° C., or preferably at 80-120° C., to form a coating 18 of the precursor of the photosensitive polyimide resin. Then, the coating 18 is exposed to light through a photo mask 19, as shown in FIG. 4(b), and, if required, its portion to be exposed to light is heated to a predetermined temperature. Thereafter, the coating 18 is developed to be formed into the predetermined pattern to cover the conductive pattern 7 and also include the cover opening portion 8, as shown in FIG. 4(c). The same conditions as those for the insulating base layer 4 can be used for exposing the insulating cover layer 9 to light and develop it. Preferably, the conductive pattern 7 is produced in the form of a negative pattern. FIG. 4 shows an illustrative example of the patterning formed by use of the negative pattern.

Figure 4D:
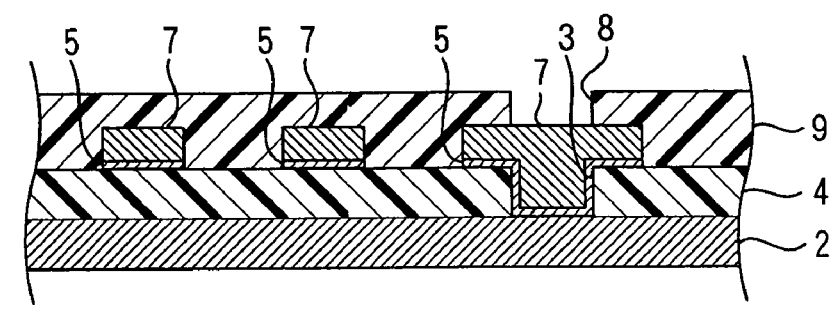

Then, the coating 18 of the precursor of the photosensitive polyimide resin thus patterned is heated finally to e.g. 250° C. or more to be cured (imidized), whereby the insulating cover layer 9 of polyimide resin is formed on the insulating base layer 4 to cover the conductive pattern 7, as shown in FIG. 4(d).

As an alternative to the photosensitive synthetic resin, for example synthetic resin may be coated over the insulating base layer 4 with the predetermined pattern or a dry film having the predetermined pattern may be adhesively stuck thereto. In this alternation, the cover opening portion 8 is formed in the patterned synthetic resin after coated or stuck, or is formed in the dry film before stuck, by a known process such as, for example, punching, drilling, laser-drilling, and etching. Preferably, the insulating cover layer 9 thus formed has thickness of e.g. 1-30 μm, or preferably 2-5 μm. No particular limitation is imposed on the shape of the cover opening portion 8. For example, the cover opening portion 8 may be formed to correspond in shape and size to the base opening portion 3.

Figure 2I:
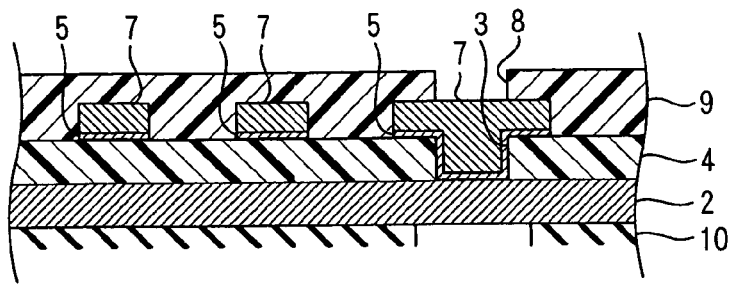

Then, an area of the metal board 2 corresponding to the base opening portion 3 and to an area of the insulating base layer 4 around the base opening portion 3 is removed from the metal board 2, in order to form the ground terminal 13, as shown in FIG. 2(i). Then, the metal board 2 is covered with an etching resist 10. The etching resist 10 is formed to have a resist pattern by a known process using a dry film photoresist for exposing the etching resist 10 to light and developing it.

Figure 2J:
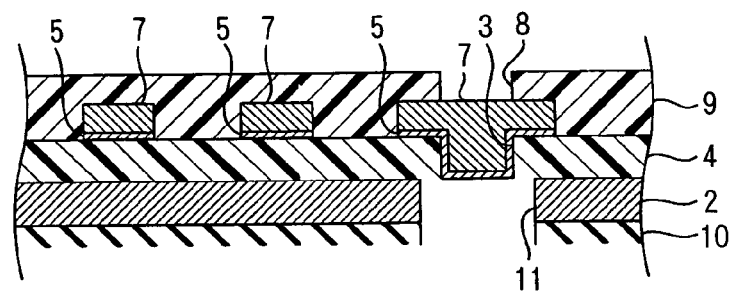

Then, the metal board 2 exposed from the etching resist 10 is removed to form a metal board opening portion 11, as shown in FIG. 2(j). The metal board 2 exposed from the etching resist 10 is removed by a known etching process such as, for example, a chemical etching (wet etching).

The metal board opening portion 11 is opened to be larger than the base opening portion 3 so that the base opening portion 3 and the area of the insulating base layer 4 around the base opening portion 3 is exposed from the metal board opening portion 11, in other words, the peripheral edge of the metal board opening portion 11 is prevented from contacting with the peripheral edge of the thin metal film 5 exposed from the base opening portion 3. This arrangement of the metal board opening portion 11 can prevent an electrolytic plating layer 12 from being formed on the surface of the metal board 2 in the next step of forming the electrolytic plating layer 12.

No particular limitation is imposed on the shape of the metal board opening portion 11. The metal board opening portion 11 may be formed in any selective form, such as a circular form and a rectangular form. Preferably, the metal board opening portion 11 is formed in a similar form to the base opening portion 3 and a different size (for example let us suppose that the base opening portion 3 is 100%, the similar form has a size of 120-1,000%).

Figure 2K:
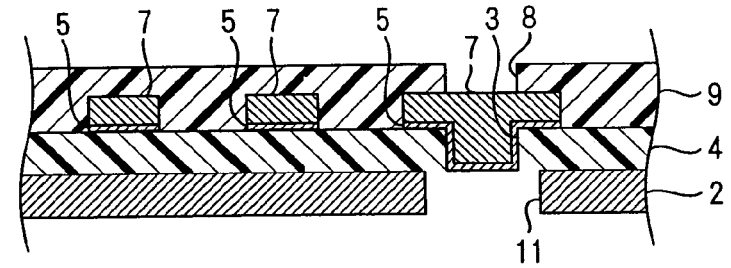
Figure 2L:
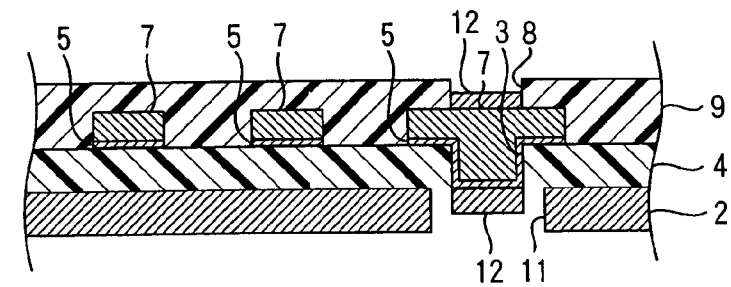
Figure 2M:
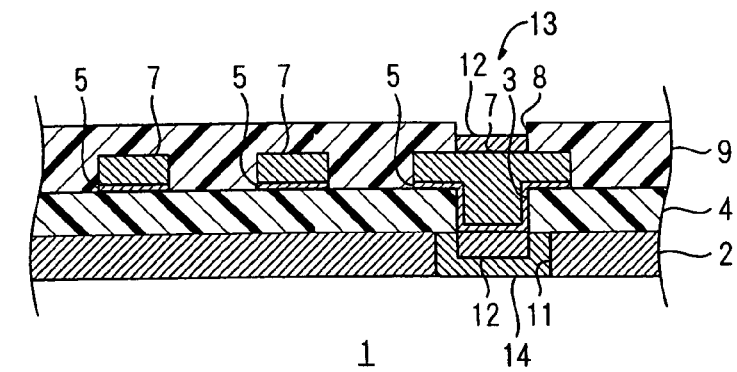

Then, the etching resist 10 is removed by a known etching process, such as a chemical etching (wet etching), or by stripping, as shown in FIG. 2(k).

Then, the electrolytic plating layer 12 is formed on the surface of the conductive pattern 7 exposed from the cover opening portion 8 by electrolytic plating, using the conductive pattern 7 as a leading portion of the electrolytic plating, as shown in FIG. 2(*l*). It should be noted here that the electrolytic plating layer 12 is formed on a surface of the thin metal film 5 exposed from the metal board opening portion 11 as well. The metals that may be used for the electrolytic plating include, for example, copper, nickel, chromium, and gold. Preferably, nickel and gold are used for the electrolytic plating. Then, the electrolytic plating, or preferably the electrolytic nickel plating and/or the electrolytic gold plating, is performed, feeding electric power from the conductive pattern 7, to form the electrolytic plating layer 12 of preferably nickel and/or gold.

In this electrolytic plating process, since the conductive pattern 7 (thin metal film 5) and the metal board 2 are not in contact with each other, as mentioned above, the electrolytic plating layer 12 is not formed on the surface of the metal board 2 even when the electric power is fed from the conductive pattern 7. Hence, the need for covering the surface of the metal board 2 with the plating resist 17 (Cf. FIG. 5) can be eliminated. Preferably, the electrolytic plating layer 12 has thickness of e.g. 0.2-6 μm, or preferably 0.5-4 μm.

Then, a metal filling layer 14 is formed in the metal board opening portion 11, to put the electrolytic plating layer 12 formed on the surface of the thin metal film 5 exposed from the metal board opening portion 11 in conductive relationship with the metal board 2, as shown in FIG. 2(*m*). The ground terminal 13 is formed in the manner mentioned above to thereby produce the suspension board with circuit 1. The metal filling layer 14 is formed, for example, by filling solder paste in an interior of the metal board opening portion 11 by screen printing, first, and, then, heating to melt the solder paste. As long as the metal filling layer 14 can be filled in a space between the electrolytic plating layer 12 formed in the metal board opening portion 11 and the metal board 2 to put them in electrically conductive relationship with each other, the metal filling layer 14 may have a properly selected thickness without any particular limitation on the thickness of the same. Preferably, the metal filling layer 14 is formed to have the same thickness as that of the metal board 2.

According to the production method of this suspension board with circuit 1, the metal board opening portion 11 is opened to be larger than the base opening portion 3, as shown in FIG. 2(*l*). This results in elimination of the need for covering the entirety of the suspension board with circuit 1 with the plating resist 17 when the electrolytic plating layer 12 is formed on the surface of the conductive pattern 7 exposed from the cover opening portion 8, feeding the electric power from the conductive pattern 7. Hence, the number of man-hour and complicated processes can be reduced for forming the ground terminal 13, thus achieving the production cost reduction.

EXAMPLE

While in the following, the present invention will be described in further detail with reference to Example, the present invention is not limited thereto.

Production of Suspension Board with Circuit

After a solution of polyamic acid resin was coated over a surface of a stainless foil having a thickness of 20 μm (Cf. FIG. 1(*a*)), the coated resin was heated at 100° C., to form a coating of the polyamic acid resin (Cf. FIG. 3(*a*)). Then, the coating thus formed was exposed to light (405 nm, 650 mJ/cm$^2$) through a photo mask (Cf. FIG. 3(*b*)) and its exposed-to-light portion was heated at 180° C. Then, it was developed using alkaline developer. The coating was formed into a pattern of a negative image including a base opening portion (Cf. FIG. 3(*c*)).

Then, the coating of polyamic acid resin thus patterned was heated at 360° C. to be cured(imidized) (Cf. FIG. 3(*d*)), whereby the insulating base layer of polyimide resin having thickness of 10 μm was formed with a predetermined pattern including the base opening portion (Cf. FIG. 1(*b*)). The base opening portion thus formed had a circular shape and a diameter of 200 μm.

Then, a thin chromium film having thickness of 300 Å and a thin copper film having thickness of 600 Å were formed in sequence on the entire surface of the insulating base layer and on a surface of the metal board exposed from the base opening portion of the insulating base layer by the sputtering process (Cf. FIG. 1(*c*)). Then, a plating resist reverse to the conductive pattern was formed on the thin metal film using a dry film photoresist (Cf. FIG. 1(*d*)). Sequentially, the conductive pattern was formed on the metal board exposed from the plating resist by electrolytic copper plating (Cf. FIG. 1(*e*)). Then, after the plating resist was removed by a chemical etching process (Cf. FIG. 1(*f*), the thin chromium film and the thin copper film in an area where the plating resist had been formed were removed by the chemical etching process (Cf. FIG. 1(*g*)). The conductive pattern was formed in the form of a wiring pattern including a signal line pattern and a ground line pattern and having thickness of 10 μm Then, after a solution of polyamic acid resin was coated over a surface of the insulating base layer including the conductive pattern, the coated resin was heated at 100° C., to form a coating of the polyamic acid resin (Cf. FIG. 4(*a*)). Then, the coating thus formed was exposed to light (405 nm, 1,200 mJ/cm$^2$) through a photo mask (Cf. FIG. 4(*b*)) and its exposed-to-light portion was heated at 180° C. Then, it was developed using alkaline developer. The coating was formed into a pattern of a predetermined pattern to cover the conductive pattern and include a cover opening portion (Cf. FIG. 4(*c*)). Then, the coating of polyamic acid resin thus patterned was heated at 360° C. to be cured (imidized) (Cf. FIG. 4(*d*)), whereby the insulating cover layer of polyimide resin having thickness of 4 μm was formed on the insulating base layer, to have a predetermined pattern including the cover opening portion.

Thereafter, an etching resist of a dry film photoresist was laminated on the surface of the stainless foil and then was exposed to light and developed, so that it was formed in the form of a resist pattern that does not include an area of the stainless foil corresponding in position to the base opening portion and an area of the insulating base layer around the base opening portion (FIG. 2(*i*)). Then, the stainless foil exposed from the etching resist was removed by the chemical etching (Cf. FIG. 2(*j*)). Thereafter, the etching resist was removed by the chemical etching, to form the metal board opening portion having a circular shape and a diameter of 500 μm (Cf. FIG. 2(*k*)). Then, a gold plating layer having thickness of 2 μm was formed on the surface of the conductive pattern exposed from the cover opening portion and on the surface of the thin metal film exposed from the metal board opening portion, using the conductive pattern as a lead portion of the electrolytic plating (Cf. FIG. 2(*l*)).

Thereafter, solder paste was filled in the metal board opening portion and reflowed, to put the gold plating layer formed on the surface of the thin metal film exposed from the metal board opening portion and the stainless foil in electrical conductive relationship, thereby forming a metal filling layer. The suspension board with circuit having the ground terminal was produced in the manner mentioned above (Cf. FIG. 2(*m*)).

While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A production method of a suspension board with circuit comprising:

the step of preparing a metal board, the step of forming on the metal board an insulating base layer having a base opening portion from which the metal board is exposed at a ground terminal forming portion thereof, the step of forming a thin metal film on the metal board exposed in the base opening portion and on the insulating base layer, the step of forming on the thin metal film a conductive pattern in such a manner as to cover the thin metal film exposed in the base opening portion, the step of forming on the insulating base layer an insulating cover layer covering the conductive pattern and having a cover opening portion which correspond in position to the base opening portion and from which the conductive pattern is exposed, the step of forming in the metal board a metal board opening portion from which the base opening portion and the insulating base layer around it are exposed, the step of forming an electrolytic plating layer on the conductive pattern exposed in the cover opening portion, feeding electric power from the conductive pattern, and the step of forming a metal filling layer in the metal board opening portion, to allow the electrolytic plating layer and the metal board to be conductive with each other.

* * * * *